(12) United States Patent
Hsueh et al.

(10) Patent No.: US 6,972,429 B1
(45) Date of Patent: Dec. 6, 2005

(54) CHALCOGENIDE RANDOM ACCESS MEMORY AND METHOD OF FABRICATING THE SAME

(75) Inventors: Ming-Hsiang Hsueh, Hsinchu (TW); Shih-Hong Chen, Hsinchu (TW)

(73) Assignee: MACRONIX International Co, Ltd., Hsinchu (TW)

( * ) Notice: Subject to any disclaimer, the term of this patent is extended or adjusted under 35 U.S.C. 154(b) by 0 days.

(21) Appl. No.: 10/905,115

(22) Filed: Dec. 16, 2004

(51) Int. Cl.[7] ............................................. H01L 29/04
(52) U.S. Cl. ..................... 257/3; 257/529; 438/95; 438/407; 438/423; 438/525
(58) Field of Search ................. 257/1–5, 529; 438/95, 96, 98, 407, 423, 525

(56) References Cited

U.S. PATENT DOCUMENTS

| | | | |
|---|---|---|---|
| 6,566,700 B2 * | 5/2003 | Xu | 257/296 |
| 6,599,840 B2 * | 7/2003 | Wu et al. | 438/705 |
| 2004/0157416 A1 * | 8/2004 | Moore et al. | 438/501 |
| 2005/0127347 A1 * | 6/2005 | Choi et al. | 257/2 |

* cited by examiner

Primary Examiner—Sara Crane
(74) Attorney, Agent, or Firm—Jiang Chyun IP Office

(57) ABSTRACT

A method of fabricating a chalcogenide random access memory (CRAM) is provided. The method is to provide a substrate having a bottom electrode thereon and then form a chalcogenide film and a patterned mask corresponding to the bottom electrode sequentially over the substrate. Thereafter, using the patterned mask, an ion implantation is performed to convert a portion of the chalcogenide film into a modified region while the chalcogenide film underneath the patterned mask is prevented from receiving any dopants and hence is kept as a non-modified region. The modified region has a lower conductivity than the non-modified region. After that, the patterned mask is removed and then a top electrode is formed over the non-modified region. Utilizing the ion implantation as a modifying treatment, the contact area between the chalcogenide film and the bottom electrode is decreased and the operating current of the CRAM is reduced.

20 Claims, 8 Drawing Sheets

000# CHALCOGENIDE RANDOM ACCESS MEMORY AND METHOD OF FABRICATING THE SAME

BACKGROUND OF THE INVENTION

1. Field of the Invention

The present invention relates to a phase transformation memory and fabricating method thereof. More particularly, the present invention relates to a chalcogenide random access memory (CRAM) and method of fabricating the same.

2. Description of the Related Art

To satisfy the need for varieties, compactness, high density, low production cost and customization in memory products, an increasing large list of memory fabrication techniques are being investigated. One type of technique that receives particular attention is a phase-transformation memory. Phase-transformation is a process of changing a material from a non-crystalline state into a crystalline state or changing the crystalline state to a non-crystalline state. Because a non-crystalline material has a different light reflecting properties and electrical resistance from a crystalline material, the non-crystalline state and the crystalline state of the material can be used to represent a "0"1 and a "1" logic state in data storage. The aforementioned phase-transformation will occur when a laser beam or an electrical field is applied.

At present, a film fabricated using a compound from an alloy system material having erasable and phase-transformable properties called chalcogenide, consisting of germanium (Ge), antimony (Sb) and tellurium (Te) of the sulfur series, can be made to phase-transformation at a relatively low voltage. Moreover, the electrical properties after the phase transformation are particularly suitable for fabricating a memory. Furthermore, the area occupation of the chalcogenide random access memory (CRAM) is only ⅓ of the magnetic random access memory (MRAM) and the ferroelectric random access memory (FeRAM) and the CRAM can easily integrate with a logic circuit. Therefore, CRAM has gradually become one of the most promising techniques for producing a whole new generation of memory products, especially for miniaturized portable products.

The chalcogenide RAM store data by effecting a phase transformation through the power source controlled by a transistor. However, the current that can be provided by a transistor is quite limited. Hence, one major issue is to achieve a balance between the operating current of the chalcogenide RAM and the current range provided by the transistor.

In addition, chalcogenide material has a coefficient of thermal expansion different from other materials commonly used in semiconductor process. Therefore, aside from balancing the difference between the operating current of the CRAM and current provided by the control transistor, the compatibility of the coefficient of thermal expansion between the chalcogenide material and surrounding materials must also be carefully considered.

SUMMARY OF THE INVENTION

Accordingly, at least one objective of the present invention is to provide a chalcogenide random access memory (CRAM) capable of reducing the difference between an operating current of the CRAM and a current provided by a control transistor.

At least a second objective of the present invention is to provide a chalcogenide random access memory (CRAM) that can reduce the operating current of the CRAM and ignore the difference in the coefficient of thermal expansion between the chalcogenide material and other materials used in semiconductor production.

At least a third objective of the present invention is to provide a method of fabricating a chalcogenide random access memory (CRAM) that can reduce the difference between the operating current of the CRAM and the current provided by a control transistor.

At least a fourth objective of the present invention is to provide a method of fabricating a chalcogenide random access memory (CRAM) that can simplify the fabrication process and reduce the operating current of the CRAM.

To achieve these and other advantages and in accordance with the purpose of the invention, as embodied and broadly described herein, the invention provides a chalcogenide random access memory (CRAM). The CRAM comprises a substrate, a first dielectric layer, a top electrode, a bottom electrode, a second dielectric layer and a chalcogenide block. The chalcogenide block comprises a non-modified region and a modified region. The first dielectric layer is disposed on the substrate surface and the bottom electrode is located within the first dielectric layer. The top electrode is disposed on the first dielectric layer in a location that corresponds with the bottom electrode. The second dielectric layer is disposed between the first dielectric layer and the top electrode. The chalcogenide block is disposed between the top electrode and the bottom electrode inside the second dielectric layer. The contact area between the non-modified region and the bottom electrode is smaller than the contact area between the non-modified region and the top electrode. The modified region of the chalcogenide block surrounds the non-modified region. Furthermore, the modified region has a lower conductivity than the non-modified region.

According to the CRAM of the present invention, the contact area between the modified region of the chalcogenide block and the bottom electrode is greater than the contact area between the modified region of the chalcogenide block and the top electrode. The modified region of the chalcogenide block contains oxygen, nitrogen, or other possible atom, ion or compound capable of reducing conductivity of the phase transformation material.

The present invention also provides another chalcogenide random access memory (CRAM). The CRAM comprises a top electrode, a bottom electrode and a chalcogenide film. The chalcogenide film comprises a non-modified region and a modified region. The bottom electrode is disposed to correspond with the top electrode. The chalcogenide film is disposed between the top electrode and the bottom electrode. The non-modified region of the chalcogenide film is in contact with the top electrode and the bottom electrode. The modified region surrounds the non-modified region. Furthermore, the modified region has a lower conductivity than the non-modified region.

According to the CRAM of the present invention, the contact area between the non-modified region of the chalcogenide film and the bottom electrode is smaller than the contact area between the non-modified region of the chalcogenide film and the top electrode. Furthermore, the modified region of the chalcogenide film contains oxygen, nitrogen, or other possible atom, ion or compound capable of reducing conductivity of the phase transformation material.

The present invention also provides a method of fabricating a chalcogenide random access memory (CRAM). First, a substrate having a first dielectric layer thereon is provided. The first dielectric layer also has a bottom electrode therein. Thereafter, a chalcogenide film is formed on the substrate and then a patterned mask is formed on the chalcogenide film. Using the patterned mask, the chalcogenide film is patterned to form a chalcogenide block that has contact with the bottom electrode. After that, using the patterned mask again, a tilt ion implantation process is carried out on the chalcogenide block to convert a peripheral region of the contact area between the chalcogenide block and the bottom electrode into a modified region. The modified region has a lower conductivity than the non-modified region of the chalcogenide block. The patterned mask is removed and then a second dielectric layer is formed over the substrate except the chalcogenide block. Finally, a top electrode is formed over the chalcogenide block.

According to the method of fabricating the CRAM of the present invention, the dopants implanted into the chalcogenide film in the aforementioned tilt ion implantation process includes oxygen ($O_2$), nitrogen ($N_2$), atomic oxygen (O), atomic nitrogen (N) or oxygen ion ($O^+$).

The present invention also provides an another method of fabricating a chalcogenide random access memory (CRAM). First, a substrate having a first dielectric layer thereon is provided. The first dielectric layer also has a bottom electrode therein. Thereafter, a chalcogenide film is formed on the substrate and then a patterned mask is formed on the chalcogenide film. The patterned mask corresponds in position with the bottom electrode. Using the patterned mask as a mask, an ion implantation process is carried out on the chalcogenide film to covert a portion of the chalcogenide film into a modified region. Meanwhile, the chalcogenide film underneath the patterned mask is prevented from receiving any dopants and hence is kept as a non-modified region. The modified region has a lower conductivity than the non-modified region of the chalcogenide film. After that, the patterned mask is removed and then a top electrode is formed over the non-modified region of the chalcogenide film.

According to the method of fabricating a CRAM of the present invention, the ion implantation process comprises implanting dopants into to the surface of the substrate perpendicularly or implanting dopants into the surface of the substrate at a tilt angle.

In the present invention, a material modification treatment is performed to reduce the contact area between the chalcogenide film and the bottom electrode inside the CRAM. Hence, the operating current of the CRAM is reduced to match the current value provided by a common control transistor. Furthermore, the aforementioned material modification treatment can simplify the production process and resolve the problems caused by a difference in the coefficient of thermal expansion between the chalcogenide material and other materials used in semiconductor fabrication.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 5A, 5B, 5C-1 and 5D-1 are schematic cross-sectional views showing the steps for fabricating a chalcogenide random access memory according to a fifth embodiment of the present invention.

FIGS. 5A, 5B, 5C-2 and 5D-2 are schematic cross-sectional views showing the steps for fabricating a chalcogenide random access memory according to a sixth embodiment of the present invention.

DESCRIPTION OF THE PREFERRED EMBODIMENTS

Figure 1:
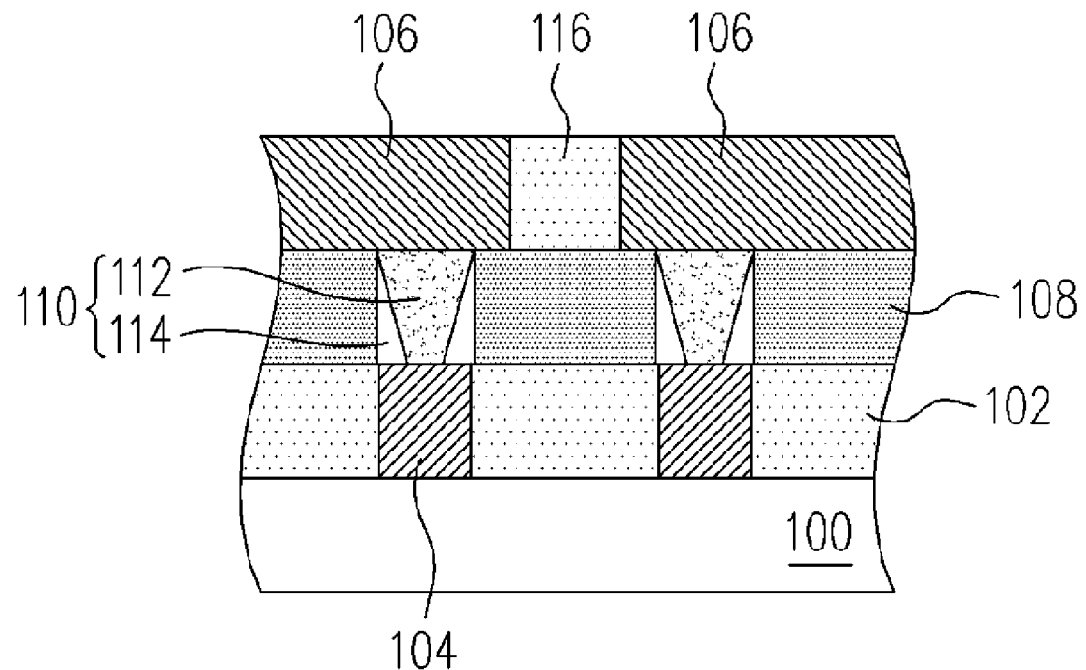
FIG. 1 is a schematic cross-sectional view of a chalcogenide random access memory according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view of a chalcogenide random access memory according to a first embodiment of the present invention. As shown in FIG. 1, the chalcogenide random access memory (CRAM) of the present embodiment mainly comprises a substrate 100, a first dielectric layer 102, a top electrode 106, a bottom electrode 104, a second dielectric layer 108 and a chalcogenide block 110. The chalcogenide block 110 further comprises a non-modified region 112 and a modified region 114. The first dielectric layer 102 is disposed on the substrate 100 and the bottom electrode 104 is located inside the first dielectric layer 102. The top electrode 106 is disposed over the first dielectric layer 102 in a position to correspond with the bottom electrode 104. The second dielectric layer 108 is disposed between the first dielectric layer 102 and the top electrode 106. The chalcogenide block 110 is disposed between the top electrode 106 and the bottom electrode 104 inside the second dielectric layer 108. The contact area between the non-modified region 112 and the bottom electrode 104 is smaller than the contact area between the non-modified region 112 and the top electrode 106. The modified region 114 of the chalcogenide block 110 surrounds the non-modified region 112. The modified region 114 has a lower conductivity than the non-modified region 112. The modified region 114 contains elements such as oxygen, nitrogen, or other possible atom, ion or compound capable of reducing conductivity of the phase transformation material for modifying the intrinsic physical properties of the chalcogenide compound.

As shown in FIG. 1, relative to the non-modified region 112, the contact area between the modified region 114 and the bottom electrode 104 can be greater than the contact area between the modified region 114 and the top electrode 106. The top electrode 106 and the bottom electrode 104 can be fabricated using a metal, a metal alloy, a semiconductor, a silicon compound, silicon or other conductive materials, for example. Furthermore, the top electrode 106 and the bottom electrode 104 can be set in an elemental state, a compound state, an alloy state or a composite state. In addition, because two chalcogenide random access memory units are displayed in FIG. 1, a dielectric layer 116 can be disposed between the two upper electrodes 106.

Because the contact area between the chalcogenide film and the bottom electrode inside the CRAM is reduced in the present embodiment, the operating current of the CRAM is lowered to match the current value capable of being provided by a common control transistor.

Figure 2:
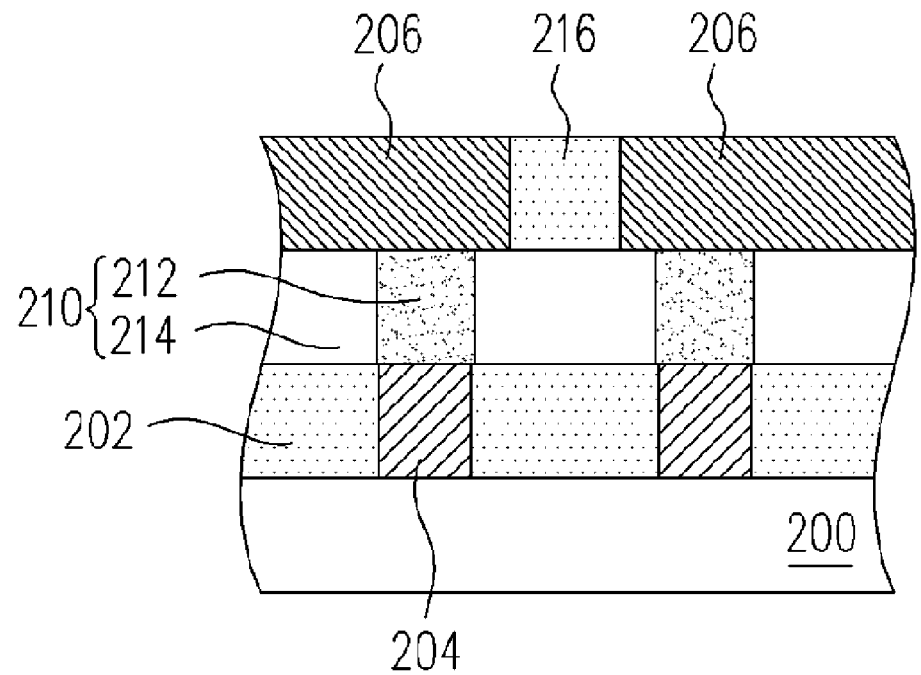
FIG. 2 is a schematic cross-sectional view of a chalcogenide random access memory according to a second embodiment of the present invention.

FIG. 2 is a schematic cross-sectional view of a chalcogenide random access memory according to a second embodiment of the present invention. As shown in FIG. 2, the chalcogenide random access memory (CRAM) in the present embodiment mainly comprises a top electrode 206, a bottom electrode 204 and a chalcogenide film 210. The chalcogenide film 210 comprises anon-modified region 212 and a modified region 214. The bottom electrode 204 is disposed to correspond to the top electrode 206. The chalcogenide film 210 is disposed between the top electrode 206 and the bottom electrode 204. Furthermore, the aforementioned structure is built up on a substrate 200. The non-modified region 212 of the chalcogenide film 210 is in contact with the top electrode 206 and the bottom electrode 204. Moreover, the contact area between the non-modified region 212 and the bottom electrode 204 is equal to the contact area between the non-modified region 212 and the top electrode 206. The modified region 214 of the chalcogenide film 210 surrounds the non-modified region 212. The modified region 214 has a lower conductivity than the non-modified region 212. In addition, the modified region 214 contains oxygen, nitrogen, or other possible atom, ion or compound capable of reducing conductivity of the phase transformation material so that the physical properties of the chalcogenide material are transformed.

As shown in FIG. 2, the materials and states of the aforementioned top electrode 206 and the bottom electrode 204 can be selected by referring to the first embodiment. Furthermore, because two chalcogenide random access memory units are shown in FIG. 2, a dielectric layer 202 is disposed between the two bottom electrodes 204 and another dielectric layer 216 is disposed between the two top electrodes 206.

In the CRAM of the present embodiment, the chalcogenide film includes a non-modified region used for phase changing and a low conductivity modified region surrounding the non-modified region. Hence, the conventional problem resulting from a difference in the coefficient of thermal expansion between the chalcogenide compound and its surrounding materials can be ignored.

Figure 3:
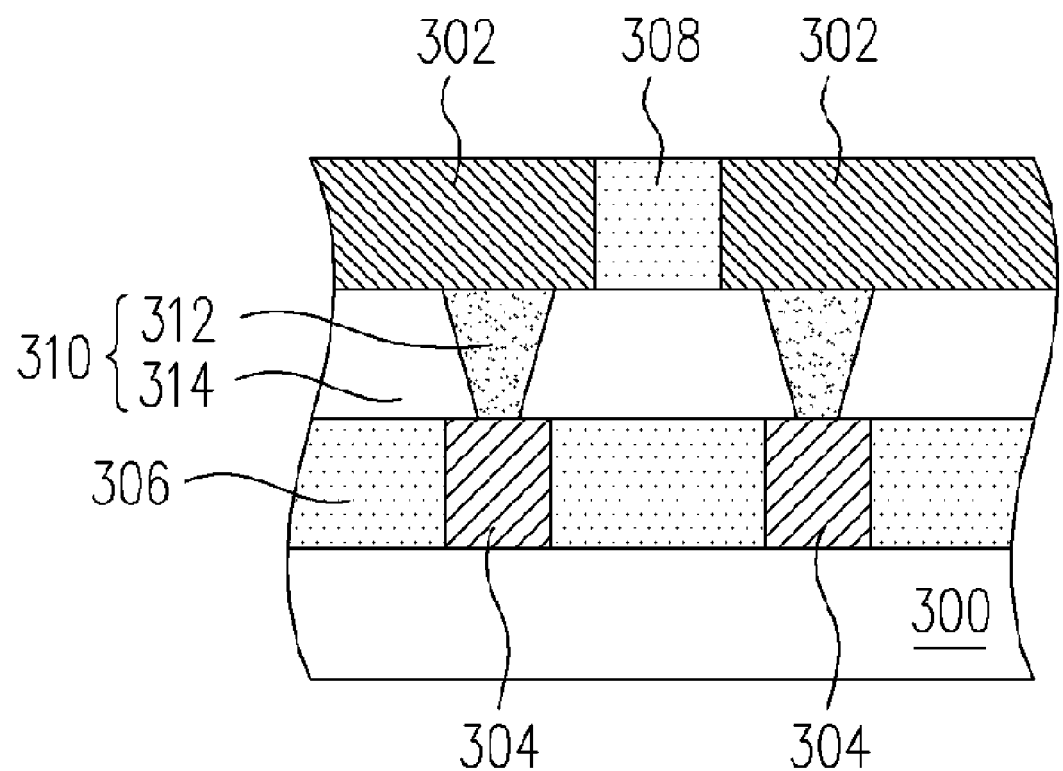
FIG. 3 is a schematic cross-sectional view of a chalcogenide random access memory according to a third embodiment of the present invention.

FIG. 3 is a schematic cross-sectional view of a chalcogenide random access memory according to a third embodiment of the present invention. As shown in FIG. 3, the chalcogenide random access memory (CRAM) in the present embodiment is very similar to the one in the second embodiment. The CRAM mainly comprises a top electrode 302, a bottom electrode 304 and a chalcogenide film 310. The chalcogenide file 210 comprises a non-modified region 312 and a modified region 314. The aforementioned structure is built up on a substrate 300. The major difference of the present embodiment from the second embodiment is that the contact area between the non-modified region 312 and the bottom electrode 304 is smaller than the contact area between the non-modified region 312 and the top electrode 306. In addition, a dielectric layer 306 is disposed between the two bottom electrodes 304 and another dielectric layer 308 is disposed between the two top electrodes 302.

In the present embodiment, because area of contact between the non-modified region of the chalcogenide film and the bottom electrode is smaller, the operating current of the CRAM is reduced. In addition, the chalcogenide film in the present embodiment may also serve as a dielectric layer of the memory so that the conventional problem resulting from the difference in the coefficient of thermal expansion between the chalcogenide compound and other materials can be avoided.

Figure 4A:
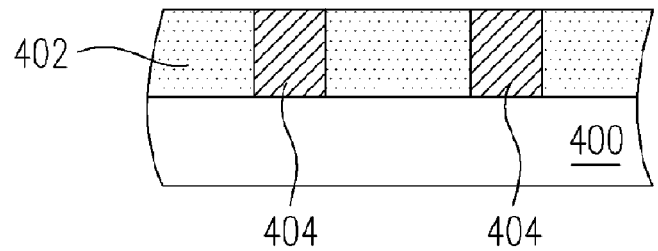
FIGS. 4A through 4F are schematic cross-sectional views showing the steps for fabricating a chalcogenide random access memory according to a fourth embodiment of the present invention.

FIGS. 4A through 4F are schematic cross-sectional views showing the steps for fabricating a chalcogenide random access memory according to a fourth embodiment of the present invention. As shown in FIG. 4A, a substrate having a first dielectric layer 402 thereon is provided. Furthermore, the first dielectric layer 402 has a bottom electrode 404 therein.

Figure 4B:
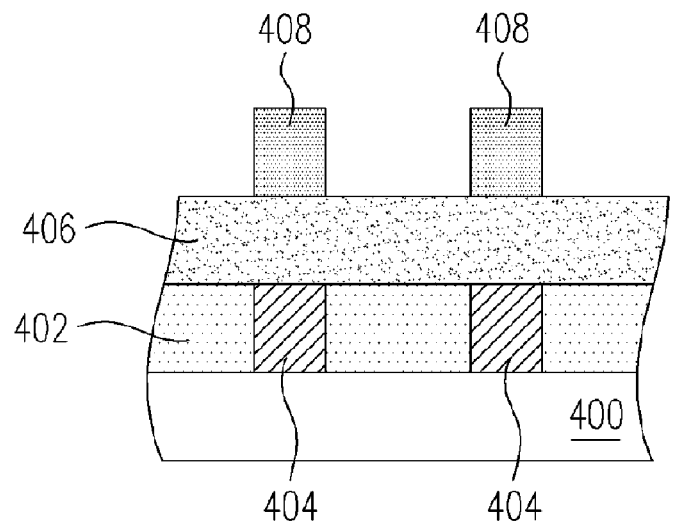

Thereafter, as shown in FIG. 4B, a chalcogenide film 406 is formed over the substrate 400 and then a patterned mask 408 is formed over the chalcogenide film 406. The patterned mask 408 is a photoresist layer or a hard mask, for example.

Figure 4C:
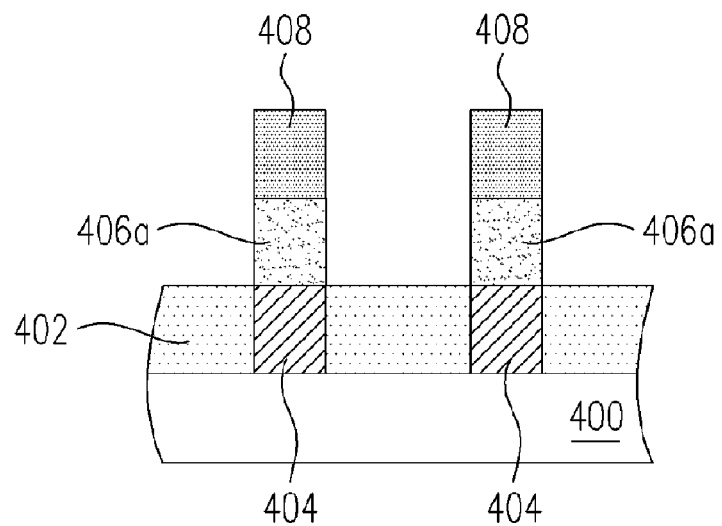

As shown in FIG. 4C, the chalcogenide film 406 (as shown in FIG. 4B) is patterned using the pattern mask 408 to form a chalcogenide block 406a in contact with the bottom electrode 404.

Figure 4D:
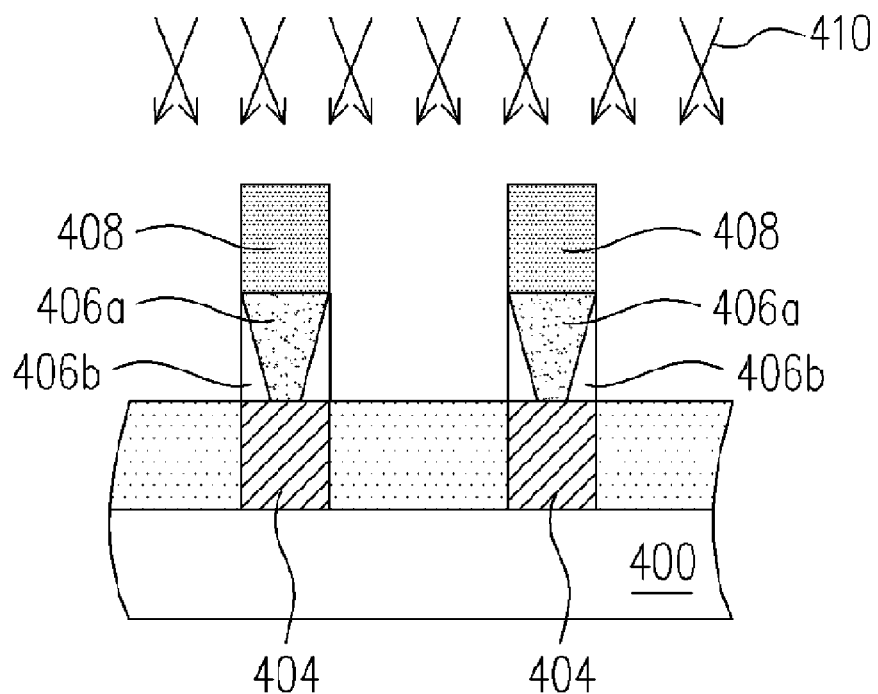

As shown in FIG. 4D, using the patterned mask 408 again, a tilt ion implantation process 410 is performed on the chalcogenide block 406a so that a peripheral portion of the contact area between the chalcogenide block 406a and the bottom electrode 404 is converted into a modified region 406b. The modified region 406b has a lower conductivity than the non-modified chalcogenide block 406a. The dopants implanted into the chalcogenide film 406 include oxygen ($O_2$), nitrogen ($N_2$), atomic oxygen (O), atomic nitrogen (N) or oxygen ion ($O^+$), for example, or other possible atom, ion or compound capable of reducing conductivity of the phase transformation material.

Figure 4E:
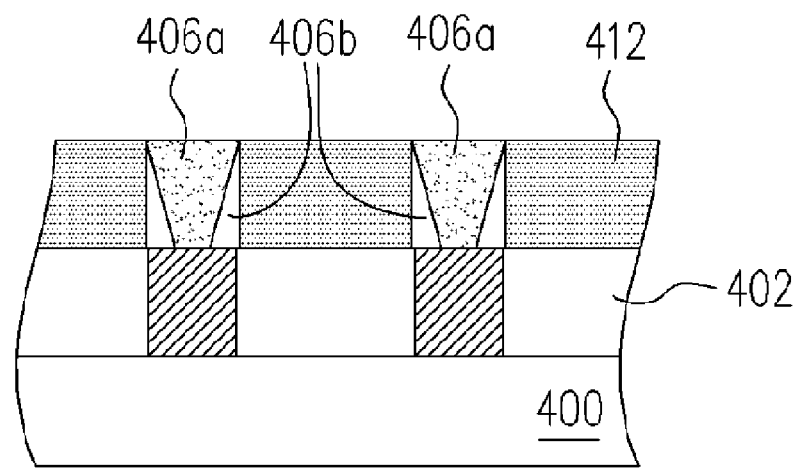

As shown in FIG. 4E, the patterned mask 408 (as shown in FIG. 4D) is removed and then a second dielectric layer 412 is formed on the substrate 400 except the chalcogenide blocks 406a and 406b.

Figure 4F:
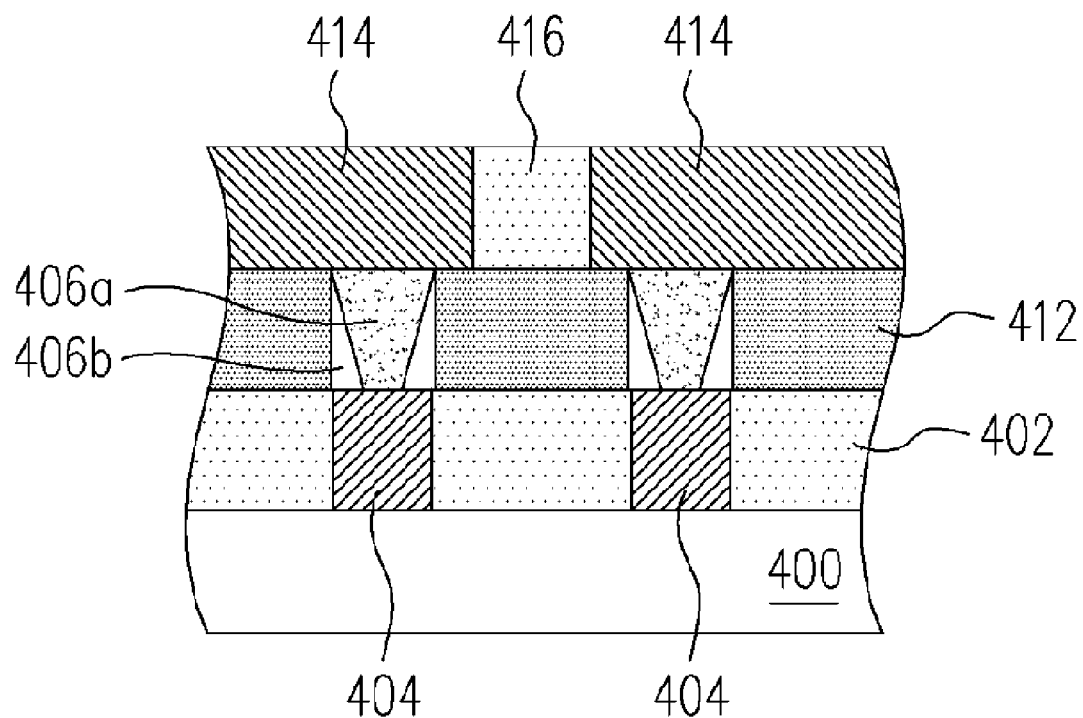

As shown in FIG. 4F, a top electrode 414 is formed over the chalcogenide block 406a and 406b and then an interlayer dielectric layer 416 is disposed between two neighboring top electrodes 414.

In the present embodiment, a special material modifying treatment, that is, the tilt ion implantation process is performed. Hence, the contact area between the chalcogenide film and the bottom electrode inside the CRAM is significantly reduced. Consequently, the operating current of the CRAM is lowered to match the current value provided by a common control transistor.

Figure 5A:
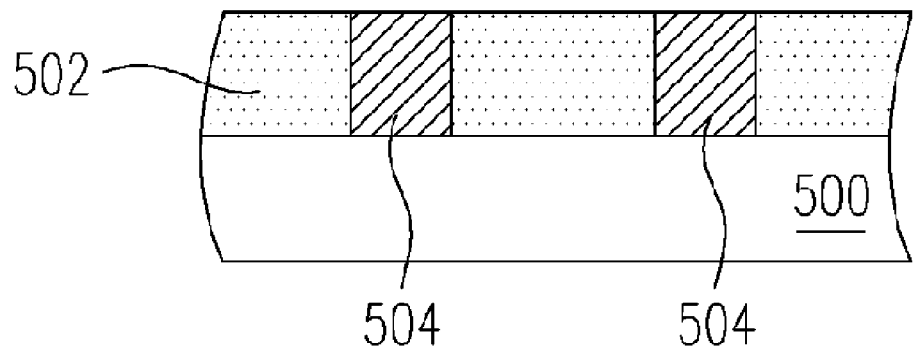

FIGS. 5A, 5B, 5C-1 and 5D-1 are schematic cross-sectional views showing the steps for fabricating a chalcogenide random access memory according to a fifth embodiment of the present invention. As shown in FIG. 5A, a substrate 500 having a first dielectric layer 502 thereon is provided. Furthermore, the first dielectric layer 502 has a bottom electrode 504 therein.

Figure 5B:
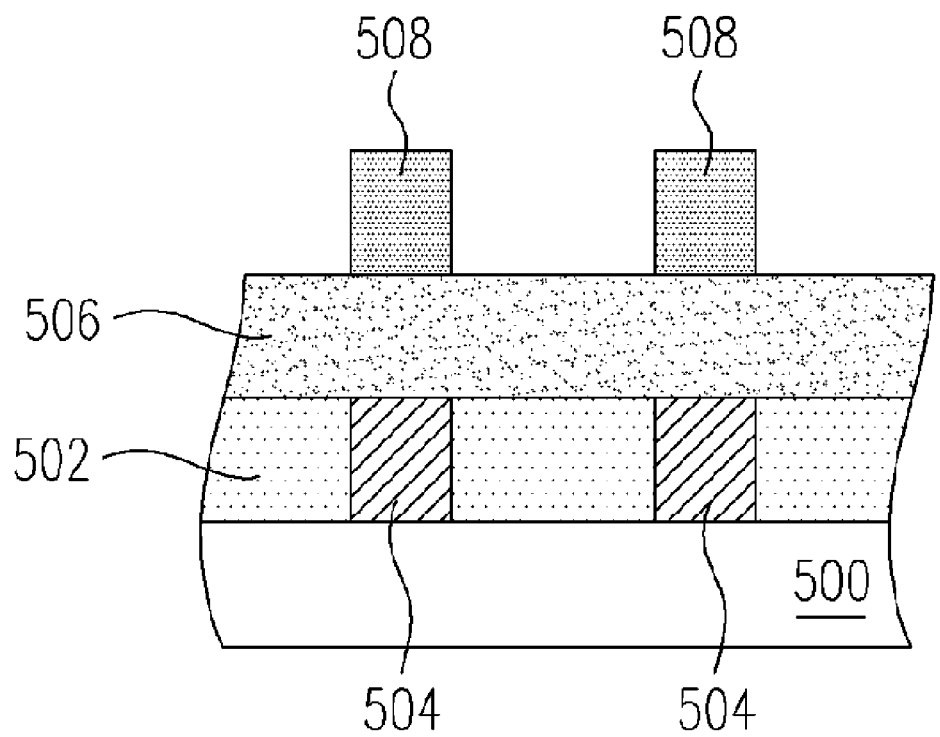

Thereafter, as shown in FIG. 5B, a chalcogenide film 506 is formed over the substrate 500 and then a patterned mask 508 is formed over the chalcogenide film 506. The patterned mask 508 is a photoresist layer or a hard mask, for example.

Figures 1, 5C:
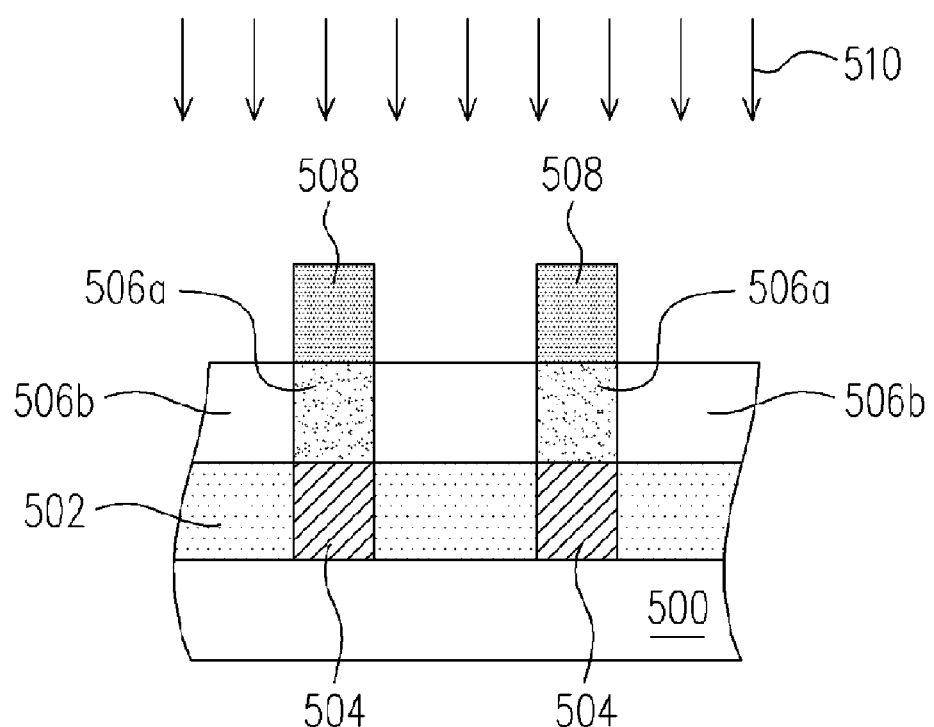

As shown in FIGS. 5C-1, an ion implantation process 510 is performed on the chalcogenide film 506 (shown in FIG. 5B). The ion implantation process 510 implants dopants vertically into the substrate 500 to convert a portion of the chalcogenide film into a modified region 506b. Meanwhile, the chalcogenide film underneath the patterned mask 508 is prevented from receiving any dopants and hence is kept as a non-modified region 506a. The modified region 506b has a lower conductivity than the non-modified region 506a. The dopants implanted into the chalcogenide film 506 in the ion implantation process 510 include oxygen, nitrogen, atomic oxygen, atomic nitrogen or oxygen ion, for example, or other possible atom, ion or compound capable of reducing conductivity of the phase transformation material.

Figures 1, 5D:
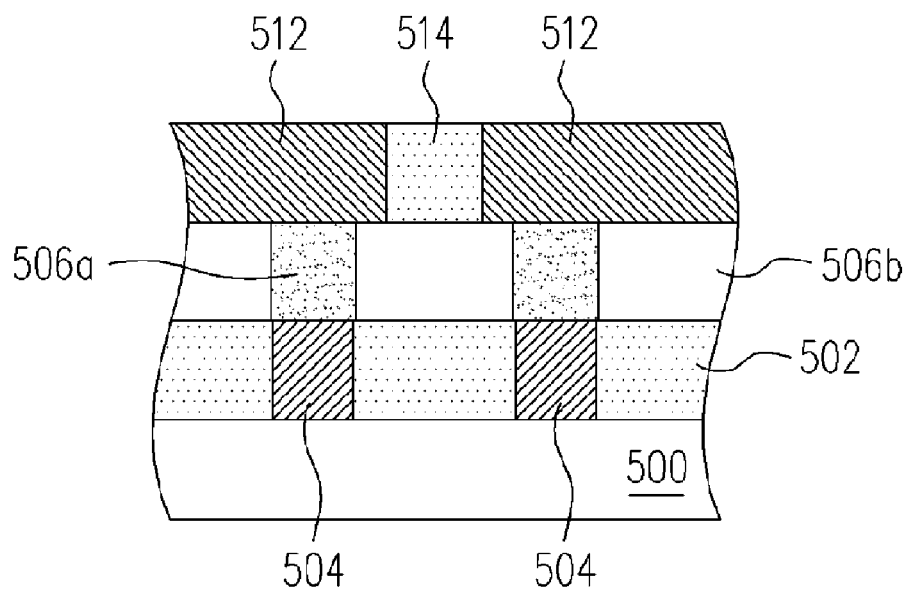
Figures 2, 5C:
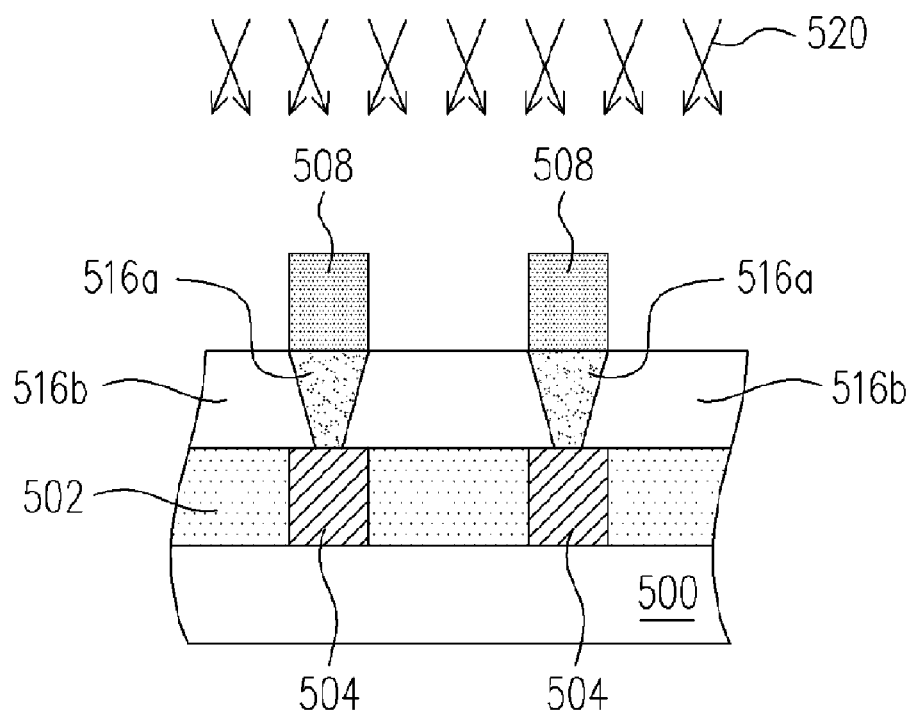
Figures 2, 5D:
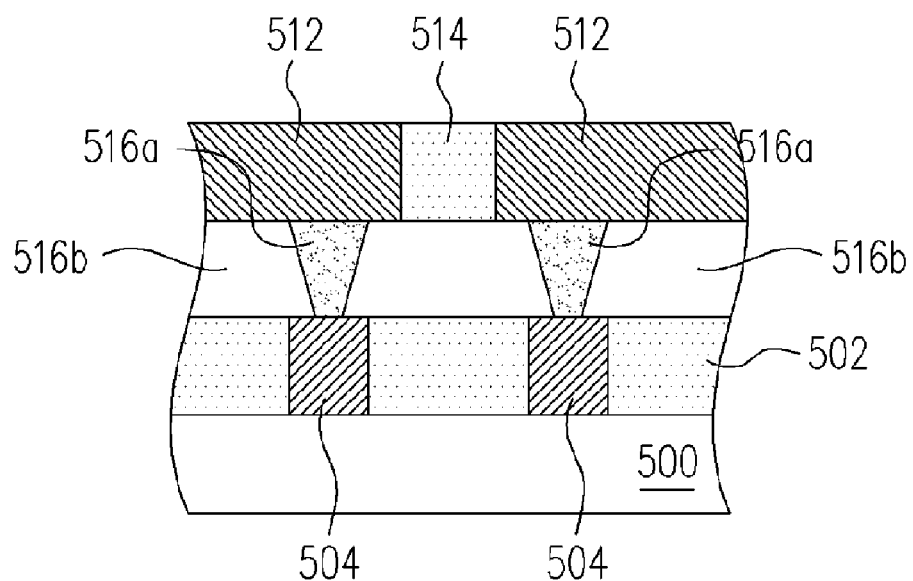

As shown in FIGS. 5D-1, the patterned mask 508 is removed and then a top electrode 512 is formed over the non-modified region 506b of the chalcogenide film. Finally, an inter-layer dielectric layer 514 is disposed between neighboring top electrodes 512.

In the present embodiment, a special material modifying treatment, that is, the ion implantation process is performed. Hence, the fabrication process is very much simplified and the problem resulting from a difference in the coefficient of thermal expansion between the chalcogenide compound and other materials used in the semiconductor fabrication process is also resolved.

FIGS. 5A, 5B, 5C-2 and 5D-2 are schematic cross-sectional views showing the steps for fabricating a chalcogenide random access memory according to a sixth embodiment of the present invention. As shown in FIGS. 5A and 5B, steps identical to the fifth embodiment are used. First, a dielectric layer 502 having a bottom electrode 504 is formed on a substrate 500. Thereafter, a chalcogenide film 506 and a patterned mask 508 are sequentially formed over the substrate 500.

As shown in FIGS. 5C-2, an ion implantation process 520 is carried out on the chalcogenide film 506 (shown in FIG. 5B) by implanting dopants at an angle of tilt relative to the surface of the substrate 500. Hence, a portion of the chalcogenide film is converted into a modified region 516b while the chalcogenide film underneath the patterned mask is prevented from receiving any dopants and hence is kept as a non-modified region 516a. The modified region 516b has a lower conductivity than the non-modified region 516a. The dopants include oxygen, nitrogen, atomic oxygen, atomic nitrogen or oxygen ion, for example, or other possible atom, ion or compound capable of reducing conductivity of the phase transformation material.

As shown in FIGS. 5D-2, the patterned mask 508 is removed and then a top electrode 512 is formed on the non-modified region 516a of the chalcogenide film.

In summary, the major characteristics of the present invention includes:

1. A material modification treatment is performed to reduce the contact area between the chalcogenide film and the bottom electrode inside the CRAM. Hence, the operating current of the CRAM is reduced to match the current value provided by a common control transistor.

2. The aforementioned material modification treatment can simplify the production process and resolve the problems caused by a difference in the coefficient of thermal expansion between the chalcogenide material and other materials used in semiconductor fabrication.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chalcogenide random access memory, comprising:
a substrate;
a first dielectric layer disposed on a surface of the substrate;
a bottom electrode disposed within the first dielectric layer;
a top electrode disposed on the first dielectric layer and in a position to correspond with the bottom electrode;
a second dielectric layer disposed between the first dielectric layer and the top electrode;
a chalcogenide block disposed inside the second dielectric layer between the top electrode and the bottom electrode, wherein the chalcogenide block comprising:
a non-modified region, wherein the contact area between the non-modified region and the bottom electrode is smaller than the contact area between the non-modified region and the top electrode; and
a modified region surrounding the non-modified region, wherein the modified region has a lower conductivity than the non-modified region.

2. The chalcogenide random access memory of claim 1, wherein the contact area between the modified region of the chalcogenide block and the bottom electrode is greater than the contact area between the modified region of the chalcogenide block and the top electrode.

3. The chalcogenide random access memory of claim 1, wherein the material constituting the top electrode and the bottom electrode comprises metal, metal alloy, semiconductor, silicon compound or a silicon material.

4. The chalcogenide random access memory of claim 1, wherein the state of the top electrode and the bottom electrode comprises an elemental state, a compound, an alloy or a composite.

5. The chalcogenide random access memory of claim 1, wherein the modified region of the chalcogenide block contains oxygen or nitrogen.

6. A chalcogenide random access memory, comprising:
a top electrode;
a bottom electrode disposed in a position to correspond with the top electrode; and
a chalcogenide film disposed between the top electrode and the bottom electrode, wherein the chalcogenide film further comprising:
a non-modified region in contact with the top electrode and the bottom electrode; and
a modified region surrounding the non-modified region, wherein the modified region has a lower conductivity than the non-modified region.

7. The chalcogenide random access memory of claim 6, wherein the contact area between the non-modified region of the chalcogenide block and the bottom electrode is smaller than the contact area between the non-modified region of the chalcogenide block and the top electrode.

8. The chalcogenide random access memory of claim 6, wherein the contact area between the non-modified region of the chalcogenide film and the bottom electrode is equal to the contact area between the non-modified region of the chalcogenide film and the bottom electrode.

9. The chalcogenide random access memory of claim 6, wherein the material constituting the top electrode and the bottom electrode comprises metal, metal alloy, semiconductor, silicon compound or a silicon material.

10. The chalcogenide random access memory of claim 6, wherein the state of the top electrode and the bottom electrode comprises an elemental state, a compound, an alloy or a composite.

11. The chalcogenide random access memory of claim 6, wherein the modified region of the chalcogenide block contains oxygen or nitrogen.

12. A method of fabricating a chalcogenide random access memory, comprising the steps of:

provide a substrate, wherein the substrate has a first dielectric layer thereon and the first dielectric layer has a bottom electrode therein;

forming a chalcogenide film over the substrate;

forming a patterned mask over the chalcogenide film;

using the patterned mask, patterning the chalcogenide film to form a chalcogenide block in contact with the bottom electrode;

using the patterned mask, performing a tilt ion implantation process on the chalcogenide block to convert a peripheral portion of the contact area between the chalcogenide block and the bottom electrode into a modified region, wherein the modified region has a lower conductivity than the non-modified chalcogenide block;

removing the patterned mask;

forming a second dielectric layer over the substrate except the chalcogenide block; and forming a top electrode over the chalcogenide block.

13. The method of claim 12, wherein the dopants implanted into the chalcogenide block in the tilt ion implantation process comprises oxygen ($O_2$), nitrogen ($N_2$), atomic oxygen (O), atomic nitrogen (N) or oxygen ion ($O^+$).

14. The method of claim 12, wherein the patterned mask comprises a photoresist mask or a hard mask.

15. A method of fabricating a chalcogenide random access memory, comprising the steps of:

providing a substrate, wherein the substrate has a dielectric layer thereon and the dielectric layer has a bottom electrode therein;

forming a chalcogenide film over the substrate;

forming a patterned mask over the chalcogenide film, wherein the patterned mask corresponds in position to the bottom electrode;

using the patterned mask, performing an ion implantation process on the chalcogenide film to convert a portion of the chalcogenide film into a modified region while the chalcogenide film underneath the patterned mask is prevented from receiving any dopants and hence is kept as a non-modified region, wherein the modified region has a lower conductivity than the non-modified region;

removing the patterned mask; and forming a top electrode over the non-modified region of the chalcogenide film.

16. The method of claim 15, wherein the ion implantation process comprises implanting dopants into the substrate at an angle perpendicular to the surface of the substrate.

17. The method of claim 16, wherein the dopants implanted into the chalcogenide film in the ion implantation process comprises oxygen, nitrogen, atomic oxygen, atomic nitrogen or oxygen ion.

18. The method of claim 15, wherein the ion implantation process comprises implanting dopants into the substrate at an angle of tilt.

19. The method of claim 18, wherein the dopants implanted into the chalcogenide film in the ion implantation process comprises oxygen, nitrogen, atomic oxygen, atomic nitrogen or oxygen ion.

20. The method of claim 15, wherein the patterned mask comprises a photoresist mask or a hard mask.

* * * * *